United States Patent
Tsuji et al.

(10) Patent No.: US 11,198,949 B2
(45) Date of Patent: Dec. 14, 2021

(54) METHOD OF PRODUCING EPITAXIAL SILICON WAFER

(71) Applicant: SUMCO CORPORATION, Tokyo (JP)

(72) Inventors: Masayuki Tsuji, Tokyo (JP); Motonori Nakamura, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 210 days.

(21) Appl. No.: 16/467,642

(22) PCT Filed: Nov. 20, 2017

(86) PCT No.: PCT/JP2017/041680
§ 371 (c)(1),
(2) Date: Jun. 7, 2019

(87) PCT Pub. No.: WO2018/123347
PCT Pub. Date: Jul. 5, 2018

(65) Prior Publication Data
US 2019/0338443 A1  Nov. 7, 2019

(30) Foreign Application Priority Data
Dec. 26, 2016 (JP) .............................. JP2016-251066

(51) Int. Cl.
*C30B 25/18* (2006.01)
*C30B 25/16* (2006.01)
*H01L 21/203* (2006.01)

(52) U.S. Cl.
CPC ............ *C30B 25/18* (2013.01); *C30B 25/165* (2013.01); *H01L 21/2033* (2013.01)

(58) Field of Classification Search
CPC ..... C23C 16/4405; C23C 16/52; C23C 16/24; C23C 25/02; C23C 29/06; H01L 21/67253; H01L 21/28194; H01L 21/02041
See application file for complete search history.

(56) References Cited

U.S. PATENT DOCUMENTS 6,074,202 A * 6/2000 Yagi ................ H01L 21/67017
  432/11
2003/0221708 A1  12/2003 Ly et al.
(Continued)

FOREIGN PATENT DOCUMENTS

JP  11-186363 A  7/1999
JP  2010-236048 A  10/2010
(Continued)

OTHER PUBLICATIONS

European Patent Office, English computer translation of JP2013123004A (Year: 2021).*

(Continued)

*Primary Examiner* — Matthew J Song
(74) *Attorney, Agent, or Firm* — Greenblum & Bernstein, P.L.C.

(57) ABSTRACT

Provided is a method of producing an epitaxial silicon wafer, which is excellent in productivity and prevents the formation of a backside haze in consecutive single-wafer processing epitaxial growth procedures on a plurality of silicon wafers without cleaning a process chamber after each epitaxial growth procedure. The method of producing an epitaxial silicon wafer includes: a step of loading a silicon wafer; a step of forming a silicon epitaxial layer; a step of unloading the silicon wafer; and a cleaning step. The cleaning step is performed before and after repeating a predetermined number of times a series of growth procedures including the silicon wafer loading step, the silicon epitaxial layer formation step, and the silicon wafer unloading step.

2 Claims, 5 Drawing Sheets

(56) References Cited

U.S. PATENT DOCUMENTS

2011/0201210 A1    8/2011  Sato et al.
2017/0018443 A1*   1/2017  Lin .................. H01L 21/67167

FOREIGN PATENT DOCUMENTS

| JP | 2013-123004 A | | 6/2013 | |
|----|---------------|---|--------|---|
| JP | 2013123004 A | * | 6/2013 | ........... H01L 21/205 |
| JP | 2014-146828 A | | 8/2014 | |
| JP | 2015-185757 A | | 10/2015 | |
| JP | 2016-58480 A | | 4/2016 | |

OTHER PUBLICATIONS

International Search Report issued in International Patent Application No. PCT/JP2017/041680, dated Jan. 16, 2018.
International Preliminary Report on Patentability (IPRP) for PCT/JP2017/041680, dated Jul. 11, 2019.
Office Action for DE App. No. 11 2017 006 558.5 dated Feb. 15, 2021 (w/ translation).
Office Action for KR App. No. 10-2019-7009859 dated May 15, 2020 (w/ translation).

* cited by examiner

METHOD OF PRODUCING EPITAXIAL SILICON WAFER

TECHNICAL FIELD

This disclosure relates to a method of producing an epitaxial silicon wafer, and in particular relates to a method of producing an epitaxial silicon wafer, in which a plurality of silicon wafers are subjected to repeated epitaxial growth procedures without cleaning a process chamber in a single-wafer processing epitaxial growth apparatus after each process.

BACKGROUND

Epitaxial silicon wafers obtained by epitaxially growing a silicon epitaxial layer on a silicon wafer are used as device substrates for fabricating various types of semiconductor devices such as metal oxide semiconductor field-effect transistors (MOSFETs), dynamic random access memories (DRAMs), power transistors, and back-illuminated solid-state imaging devices.

Figure 1:
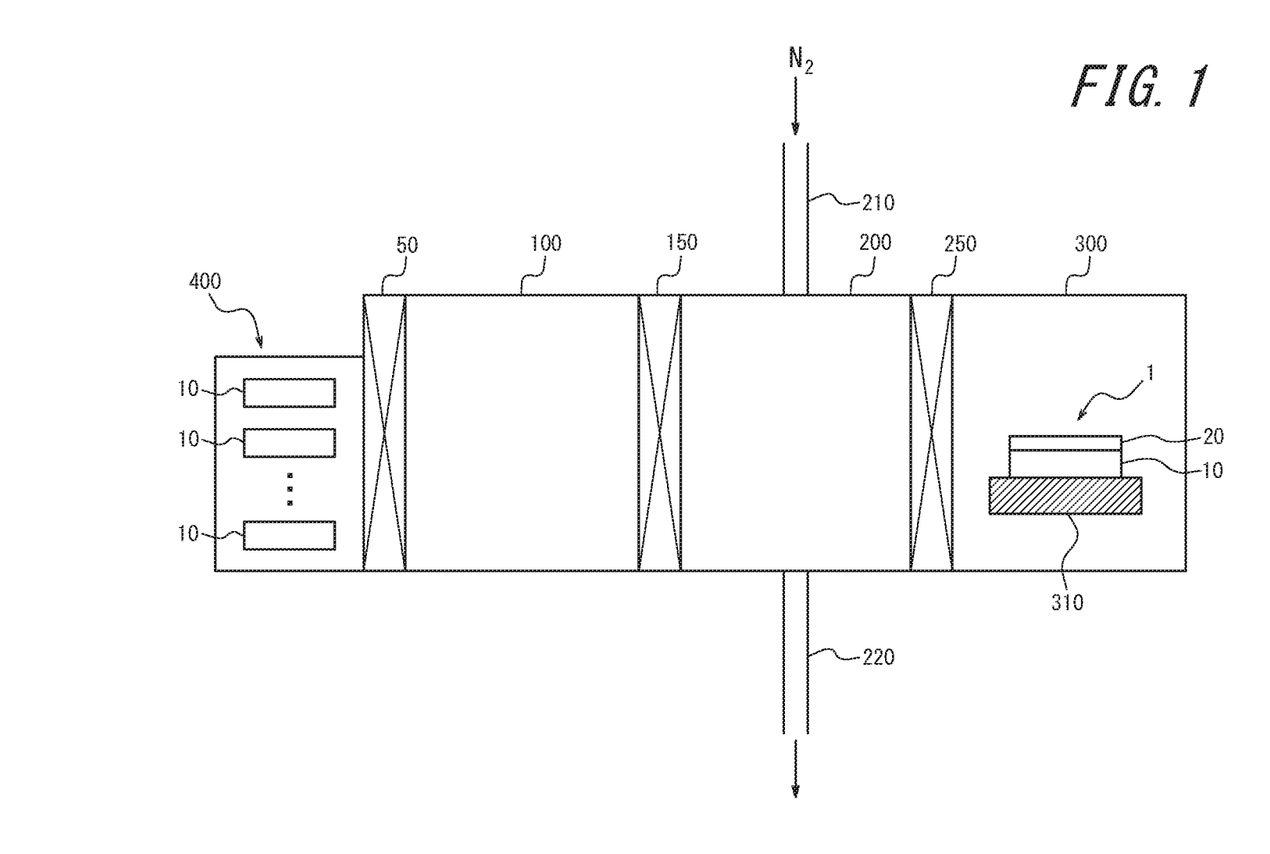
FIG. 1 is a schematic view illustrating a typical single-wafer processing epitaxial growth apparatus.

Epitaxial growth on a silicon wafer is typically performed using a single-wafer processing epitaxial growth apparatus. FIG. 1 depicts a typical single-wafer processing epitaxial growth apparatus. This single-wafer processing epitaxial growth apparatus includes a load-lock chamber 100 with a nitrogen atmosphere, a transfer chamber 200 with a nitrogen atmosphere, a process chamber 300 with a hydrogen atmosphere, and a storage enclosure 400. A series of epitaxial growth procedures is described with reference to FIG. 1.

The storage enclosure 400 and the load-lock chamber 100 are connected using a gate valve 50. The gate valve 50 is opened to unload a silicon wafer 10 from the storage enclosure 400 to the load-lock chamber 100. The gate valve 50 is closed again. Further, a gate valve 150 between the load-lock chamber 100 and the transfer chamber 200 is opened to remove the silicon wafer 10 from the load-lock chamber 100 using a transfer unit (not shown). Further, the silicon wafer 10 is transferred to the transfer chamber 200, and the gate valve 150 is closed.

Next, when a gate valve 250 between the transfer chamber 200 and the process chamber 300 is opened, the silicon wafer 10 is transferred from the transfer chamber 200 to the process chamber 300 using the transfer unit. When the silicon wafer 10 is placed on a susceptor 310 in the process chamber 300, the gate valve 250 is closed. After that, the silicon wafer 10 is subjected to epitaxial growth in the process chamber 300, and a silicon epitaxial layer 20 is formed on the silicon wafer 10, thus an epitaxial silicon wafer 1 is obtained.

The resultant epitaxial silicon wafer 1 is transferred from the process chamber 300 to the load-lock chamber 100 via the transfer chamber 200 through the above series of growth procedures in the reverse order to the order of the above described series of growth procedures, and is then stored in a wafer storage enclosure. A single-wafer processing epitaxial growth apparatus is usually provided with, in addition to the load-lock chamber 100 and the storage enclosure 400 for removing the silicon wafer 10 to be subjected to epitaxial growth (hereinafter also referred to as "film deposition"), a load-lock chamber and a storage enclosure for storing epitaxial silicon wafers 1 having been subjected to film deposition. Note that the load-lock chamber and the wafer storage enclosure for storing are not shown in FIG. 1 for brevity.

For example, JP H11-186363 A (PTL 1) discloses a semiconductor processing apparatus having a load-lock chamber including a storage enclosure for storing semiconductor wafers, which chamber is used to load and unload semiconductor substrates; a process chamber for processing the semiconductor substrates; and a transfer chamber which is connected to the load-lock chamber and the process chamber with respective gate valves and is used to transport the semiconductor substrate between the adjacent chambers.

Here, when epitaxial growth is performed, silicon is deposited to form a silicon epitaxial layer on a silicon wafer surface; however, silicon is also deposited on the inner wall surface of the process chamber, a susceptor, etc. This being the case, after the epitaxial growth, the inside of the process chamber is cleaned by vapor phase etching of the deposit using for example hydrochloric gas.

The methods of cleaning the process chamber in epitaxial growth performed using an epitaxial growth apparatus can be roughly divided into the following two categories. A first method is a method in which the inside of the process chamber is cleaned each time an epitaxial growth process is performed (hereinafter referred to as "single depo process"). A second method is a method in which an epitaxial growth process is repeated on a plurality of silicon wafers without cleaning the process chamber after each epitaxial growth process (hereinafter referred to as "multi depo process").

Figure 2:
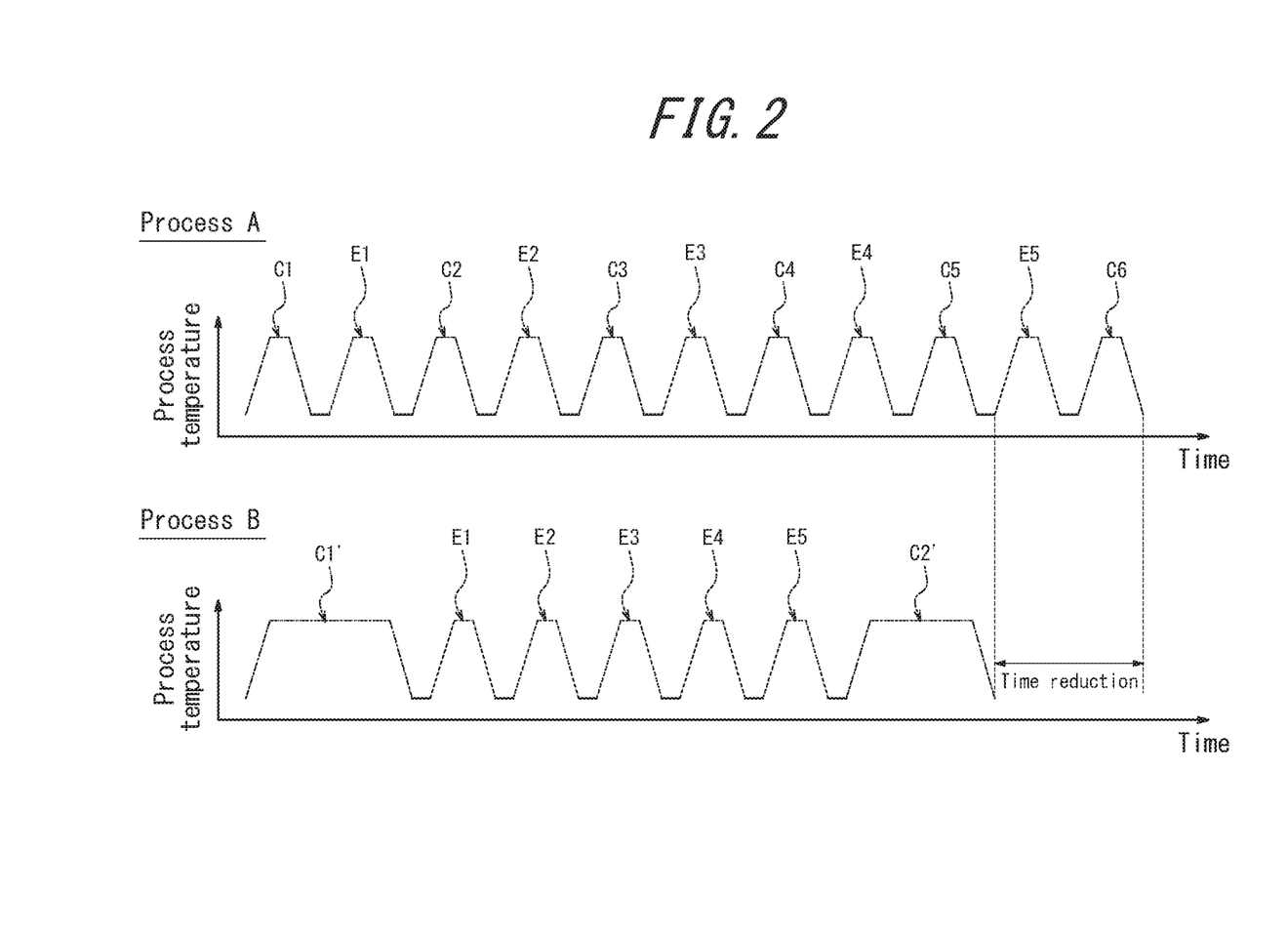
FIG. 2 is a diagram illustrating cleaning methods for a process chamber of a single-wafer processing epitaxial growth apparatus.

Differences between the single depo process and the multi depo process are further described using the examples of Process A and Process B illustrated in FIG. 2. In the single depo process, as in Process A illustrated in FIG. 2, a cleaning procedure C1 of the process chamber is performed first, and an epitaxial growth procedure E1 is then performed on a first silicon wafer loaded into the process chamber through a load-lock chamber and a transfer chamber from a storage enclosure, thus a first silicon epitaxial wafer is formed. Next, the silicon epitaxial wafer formed is unloaded through the transfer chamber from the process chamber to a load-lock chamber and a storage enclosure for storing in order. After a cleaning procedure C2 for the process chamber is performed, a second silicon wafer is loaded into the process chamber and subjected to an epitaxial growth procedure E2, thus a second silicon epitaxial wafer is formed. Such cleaning and epitaxial growth procedures are sequentially repeated to form five silicon epitaxial wafers in the example of Process A in FIG. 2.

Epitaxial growth procedures E1, E2, . . . , and E5 include heating, hydrogen bake-out, film deposition, and cooling, and the processes are indicated by the process temperatures in Process A in FIG. 2. The same characters are also used for Process B. Further, cleaning procedures C1. C2, . . . and C6 include a heating process, a hydrogen bake-out process, a vapor phase etching process, a Si coating process on a susceptor, and a cooling process, and as in the epitaxial growth procedures, the processes of the cleaning procedures are indicated by the process temperatures in Process A of FIG. 2. The same applies to cleaning procedures C1' and C2' in Process B.

On the other hand, in the multi depo process, the cleaning procedure C1' for the process chamber is performed first as illustrated in Process B of FIG. 2. A silicon wafer is then loaded into the process chamber, and subjected to the epitaxial growth procedure E1, thus an epitaxial silicon wafer is formed. The epitaxial silicon wafer formed is unloaded through the load-lock chamber and the storage enclosure for storing in order; however, the next silicon wafer is loaded into the process chamber without performing cleaning. Thus, a plurality of silicon wafers are subjected to repeated epitaxial growth procedures without cleaning after each epitaxial growth procedure, and after performing the epitaxial growth procedure a predetermined number of times (five times in Process B of FIG. 2), the cleaning procedure C2' for the process chamber is performed (the cleaning procedure C2' may also serve as cleaning for the next depo process of the multi depo process). Note that the above predetermined number of times, that is, the number of the epitaxial growth procedures repeated without cleaning in the multi depo process is hereinafter referred to as "multi depo number".

In the single depo process, silicon deposit in the process chamber can be eliminated each time an epitaxial growth procedure is performed, so that stable quality can be achieved as compared with the multi depo process. This is because silicon deposit in the process chamber increases as each epitaxial growth procedure is performed as described above.

On the other hand, in the multi depo process, as can be seen from the comparison of the elapsed time between Process A and Process B illustrated in FIG. 2, the processing time of each cleaning procedure is longer than that in the single depo process. However, when the same number of epitaxial silicon wafers are formed, the total processing time is usually shorter in the multi depo process than in the single depo process, thus the multi depo process is excellent in productivity. Accordingly, one of those processes is used depending on the specification of the epitaxial silicon wafer to be formed. Note that the processing time of a cleaning procedure is longer in the multi depo process because the amount of silicon deposit is increased while a plurality of epitaxial growth procedures are performed unlike in the single depo process.

JP 2013-123004 A (PTL 2) describes that when the multi depo process is performed many times, a so-called backside haze would easily be formed on the backside surface of an epitaxial silicon wafer in the latter half of the multi depo process to cause poor appearance. In PTL 2, the formation of a backside haze is prevented in the multi depo process by controlling the heating process in the process chamber in the hydrogen bake-out step.

CITATION LIST

Patent Literature

PTL 1: JP H11-186363 A
PTL 2: JP 2013-123004 A

SUMMARY

Technical Problem

Since an epitaxial silicon wafer having a backside haze is regarded as a defective product, when the multi depo process is used, the multi depo number is required to be set within the range where the backside haze described above is not formed. In order to improve the production efficiency for the epitaxial silicon wafer, it is preferred in terms of improving the productivity, that the maximum number of times the multi depo process can be repeated (hereinafter "maximum multi depo number") is increased, and the multi depo process is performed the maximum multi depo number of times because the productivity can be improved. Although the technique described in PTL 2 can increase the maximum multi depo number, there is still room for improvement.

First, since the maximum multi depo number varies depending on the conditions such as apparatus specifications and epitaxial growth conditions in the multi depo process, the multi depo number needs to be considered and adjusted as occasion demands. A multi depo number that is smaller than an expected maximum multi depo number by a degree which does not cause a backside haze can almost ensure the formation of a backside haze to be prevented; however, such a number results in insufficient productivity.

It could therefore be helpful to provide a method of producing an epitaxial silicon wafer, which is excellent in productivity and prevents the formation of a backside haze in repeating single-wafer processing epitaxial growth procedures on a plurality of silicon wafers without cleaning a process chamber after each epitaxial growth procedure.

Solution to Problem

We made various studies to achieve the above objective. We first studied the cause of the formation of a back surface in the latter half of the process of the multi depo process whereas no backside haze is formed in an early stage of the process when a plurality of silicon wafers are subjected to repeated single-wafer processing epitaxial growth procedures without cleaning a process chamber after each epitaxial growth procedure, namely, subjected to the multi depo process. Here, it is conceivable that the formation of a backside haze is caused on a natural oxide layer left unreduced by hydrogen gas on the back surface of a silicon wafer, due to mass transfer or etching caused by a reaction between a gas containing chlorine (Cl) that reaches the back surface of the silicon wafer and silicon on the susceptor.

In the process of the multi depo process, a load-lock chamber and a transfer chamber are kept flushed with nitrogen gas by nitrogen gas purging in order to maintain a nitrogen atmosphere in the chambers. However, when a silicon wafer is loaded into the transfer chamber from the load-lock chamber, residual oxygen from the atmosphere, albeit slight, is considered to be flown into the transfer chamber. Further, in the transfer chamber, oxygen from a natural oxide layer with a thickness of several nanometers formed on a bare silicon surface of the silicon wafer is also present.

Although the transfer chamber is kept flushed with nitrogen gas, such oxygen is considered to gradually accumulate and build up in the transfer chamber as the process of the multi depo process proceeds. For example, as the process proceeds in the latter half of the multi depo process, oxygen is presumed to accumulate for example through adsorption and desorption to/from the inner surface of the transfer chamber. We concluded that such oxygen accumulation in the transfer chamber, albeit slightly, increases the thickness of the natural oxide layer and would result in the formation of a backside haze in the latter half of the multi depo process.

Against this backdrop, we changed the number of nitrogen flushing operations on the transfer chamber focusing on the evacuation rate of oxygen in the transfer chamber, and found that the maximum multi depo number, that is, the maximum number of times the multi depo process can be performed varied. We made further studies and found that the multi depo number greatly depends on the above number of purge operations. This discovery leads to this disclosure.

Specifically, this disclosure primarily includes following features.

(1) A method of producing an epitaxial silicon wafer, which epitaxially grows a silicon epitaxial layer on a silicon wafer, comprising:

a first step of loading a single silicon wafer from a first load-lock chamber into a transfer chamber kept purged with nitrogen gas;

a second step of loading the single silicon wafer from the transfer chamber into a process chamber;

a third step of forming a silicon epitaxial layer on a surface of the single silicon wafer in the process chamber;

a fourth step of unloading the single silicon wafer on which the silicon epitaxial layer is formed, from the process chamber to the transfer chamber and then unloading the single silicon wafer to the second load-lock chamber; and a cleaning step of vapor etching in the process chamber with a gas containing hydrogen chloride, wherein the cleaning step is performed before and after repeating a predetermined number of times a series of growth procedures including the first step, the second step, the third step, and the fourth step under the same conditions, and a correspondence between a total number of nitrogen purges on the transfer chamber throughout the series of growth procedures performed the predetermined number of times and a maximum number of the series of the growth procedures is predetermined, and the predetermined number of times is set within the maximum number of the series of the growth procedures.

(2) The method of producing an epitaxial silicon wafer, according to (1) above, wherein the maximum number of the series of the growth procedures is determined based on a threshold number of times by which a backside haze is formed on a back surface of the epitaxial silicon wafer.

(3) The method of producing an epitaxial silicon wafer, according to (1) or (2) above, wherein in predetermining the correspondence, a nitrogen purge gas flow rate for the transfer chamber is changed, and an exhaust velocity for the transfer chamber is adjusted depending on the change of the nitrogen purge gas flow rate.

Advantageous Effect

This disclosure provides a method of producing an epitaxial silicon wafer, which is excellent in productivity and prevents the formation of a backside haze in repeating single-wafer processing epitaxial growth procedures on a plurality of silicon wafers without cleaning a process chamber after each epitaxial growth procedure.

DETAILED DESCRIPTION

Embodiments of this disclosure will now be described with reference to the drawings. Note that only main features of the structure are schematically depicted for brevity.

(Method of Producing Epitaxial Silicon Wafer)

A method of producing an epitaxial silicon wafer according to this embodiment is a method of producing an epitaxial silicon wafer, which epitaxially grows a silicon epitaxial layer on a surface of a silicon wafer. Here, in describing the production method according to this embodiment, the reference numerals for the typical single-wafer processing epitaxial growth apparatus described above with reference to FIG. 1 are used.

The production method of this embodiment includes a first step of loading a single silicon wafer 10 from a first load-lock chamber 100 into a transfer chamber 200 kept flushed with nitrogen gas; a second step of loading the single silicon wafer 10 from the transfer chamber 200 into a process chamber 300; a third step of forming a silicon epitaxial layer 20 on a surface of the single silicon wafer 10 in the process chamber 300; a fourth step of unloading the single silicon wafer 10 on which the silicon epitaxial layer 20 is formed (i.e., an epitaxial silicon wafer 1) from the process chamber 300 to the transfer chamber 200 and then to a second load-lock chamber (not shown); and a cleaning step of vapor etching in the process chamber 300 with a gas containing hydrogen chloride.

As in the multi depo process described with reference to Process B in FIG. 2, the cleaning step is performed before and after repeating a predetermined number of times a series of growth procedures including the first step, the second step, the third step, and the fourth step under the same conditions. Here, in this embodiment, the correspondence between the total number of nitrogen flushing operations on the transfer chamber throughout the series of growth procedures performed the predetermined number of times and the maximum number of the series of growth procedures is predetermined, and the predetermined number of times is set within the maximum number of the series of growth procedures.

In this embodiment, hereinafter, the process of repeating the above series of growth procedures a predetermined number of times under the same conditions is referred to as "multi depo process", and the foregoing predetermined number of times is referred to as "multi depo number", and the above maximum number of the series of growth procedures is referred to as "maximum multi depo number". When the multi depo process is performed a number of times exceeding the maximum multi depo number even once, faults such as a backside haze are caused. Further, epitaxial growth procedures of the Nth multi depo process (where N is an integer equal to or more than 1 and less than the maximum multi depo number) are referred to as "growth procedures of the Nth deposition".

First, a typical single-wafer processing epitaxial growth apparatus which can be used in the production method according to this embodiment is described with reference to FIG. 1 mentioned above.

The single-wafer processing epitaxial growth apparatus includes a first load-lock chamber 100, a transfer chamber 200, and a process chamber 300. The first load-lock chamber 100 and the transfer chamber 200 are connected via a gate valve 150, and the transfer chamber 200 and the process chamber 300 are connected via a gate valve 250. The first load-lock chamber 100 is evacuated by a pump and purging with nitrogen gas, thus a nitrogen atmosphere is maintained in the chamber. Further, the transfer chamber 200 is evacuated and purged with nitrogen gas, thus a nitrogen atmosphere is maintained in the chamber. Further, the process chamber 300 is evacuated and purged with hydrogen gas so that a hydrogen atmosphere can be maintained in the chamber. Note that since source gases for epitaxial growth, etching gas for cleaning, etc. are introduced into the process chamber 300, these gases are collected in a gas scrubber.

On the other hand, the first load-lock chamber 100 is also connected to a storage enclosure 400 for storing a silicon wafer 10 via a gate valve 50. The first load-lock chamber 100 may receive or send the storage enclosure 400 from/to the outside of the epitaxial growth apparatus, and when the storage enclosure 400 is a front opening unified pod (FOUP), the first load-lock chamber 100 may receive or send a single silicon wafer 10 unloaded from the FOUP. FIG. 1 is a schematic view illustrating the case where the silicon wafer storage enclosure 400 is a FOUP. In the example illustrated in FIG. 1, the first load-lock chamber 100 is connected to the storage enclosure 400 via the gate valve 50, and silicon wafers 10 are taken out of the storage enclosure 400 one by one by a robot (also called a factory interface: F1, for example) not shown. Here, when the storage enclosure 400 or a silicon wafer 10 from the FOUP is loaded and unloaded into/from the first load-lock chamber 100, the air flows into the load-lock chamber 100. To address this risk, the first load-lock chamber 100 is flushed with nitrogen that is an inert gas, thus a nitrogen atmosphere is maintained. Note that in addition to the first load-lock chamber 100 and the storage enclosure 400 from which silicon wafers 10 to be subjected to deposition are taken out, a second load-lock chamber and a storage enclosure for storing epitaxial silicon wafers 1 having been subjected to deposition are typically provided in a single-wafer processing epitaxial growth. The first load-lock chamber 100 and the second load-lock chamber have the same functions, for example, being flushed with nitrogen, except that they have different transfer paths.

Note that the storage enclosure 400 used for silicon wafers, can be a silicon wafer storage enclosure used to transfer or store semiconductor wafers, which is, for example, an enclosure called a FOUP as mentioned above or a front opening sipping box (FOSB) that is standardized by the SEMI Standards. The storage enclosure 400 can store for example 25 silicon wafers 10.

A wafer transfer unit (not shown) for transferring the silicon wafers 10 is placed in the transfer chamber 200. The transfer chamber 200 is also flushed with nitrogen which is an inert gas, to be filled with nitrogen gas, thus a nitrogen atmosphere is maintained. Specifically, nitrogen gas is introduced through an inlet tube 210 depicted in FIG. 1, and the gas inside the transfer chamber 200 is exhausted through an outlet tube 220.

When the silicon wafers 10 to be subjected to deposition are loaded into the process chamber 300, the silicon wafers 10 are carried one by one by the wafer transfer unit from the first load-lock chamber 100 into the transfer chamber 200 and from the transfer chamber 200 into the process chamber 300. Note that when the silicon wafers 10 are carried between the chambers, the gate valves 150 and 250 are sequentially opened, and the gate valves 150 and 250 are closed except when the wafers are loaded into the chambers. Therefore, the nitrogen atmosphere of the first load-lock chamber 100 and the hydrogen atmosphere of the process chamber 300 do not come in contact with each other.

A susceptor 310 on which the silicon wafer 10 is placed is placed inside the process chamber 300. A silicon epitaxial layer 20 can be formed by performing epitaxial growth in the process chamber 300.

A silicon wafer 10 on which the silicon epitaxial layer 20 has been formed (i.e., an epitaxial silicon wafer 1) is typically unloaded to the second load-lock chamber and the storage enclosure for storing in the reverse order to the order of the above described loading operation.

The steps of the method of producing an epitaxial silicon wafer, according to this embodiment will now be described in detail.

<First Step>

In the first step, a single silicon wafer 10 is loaded from the first load-lock chamber 100 into the transfer chamber 200 kept flushed with nitrogen gas. When the silicon wafers 10 are loaded, the silicon wafers 10 are taken out of the storage enclosure 400 one by one, or the silicon wafer storage enclosure 400 is loaded into the first load-lock chamber 100 as described above. Further, when the silicon wafer 10 is loaded into the transfer chamber 200, the gate valve 150 is opened, and the silicon wafer 10 is loaded by the transfer unit in the transfer chamber 200 from the first load-lock chamber 100 into the transfer chamber 200. After this loading, the gate valve 150 is closed. The gate valve 150 is usually opened for a time period of approximately 5 s to 15 s, and this also applies to the other gate valves.

<Second Step>

In the second step, the silicon wafer 10 is loaded from the transfer chamber 200 into the process chamber 300. When the silicon wafer 10 is loaded, the gate valve 250 is opened, and the silicon wafers 10 are loaded from the transfer chamber 200 into the process chamber 300 by the transfer unit in the transfer chamber 200. Here, the silicon wafer 10 can be placed on the susceptor 310 in the process chamber 300 using the transfer unit. The temperature inside the process chamber 300 when the silicon wafer 10 is loaded into the chamber is typically around 650° C. or more and 800° C. or less.

<Third Step>

In the third step, a silicon epitaxial layer 20 is formed on a surface of the single silicon wafer 10 in the process chamber 300. For example, source gases such as dichlorosilane, trichlorosilane, etc. are introduced into the process chamber 300 using hydrogen as a carrier gas, and epitaxial growth can be performed on the silicon wafer 10 by CVD at temperatures in the range of 1000° C. to 1200° C. although depending on the source gases used. Thus, the epitaxial silicon wafer 1 can be formed.

<Fourth Step>

In the fourth step, the single silicon wafer 10 on which the silicon epitaxial layer 20 is formed (i.e., the epitaxial silicon wafer 1) is unloaded from the process chamber 300 to the transfer chamber 200 and then to the second load-lock chamber (not shown). Specifically, the formed epitaxial silicon wafer 1 is transferred from the process chamber 300 to the load-lock chamber through the transfer chamber 200 in the reverse order to the orders of the first step and the second step described above, and the epitaxial silicon wafer is stored in the storage enclosure for storing.

As described above, through the series of growth procedures including the first step, the second step, the third step, and the fourth step, a single epitaxial silicon wafer 1 can be formed using the single-wafer processing epitaxial growth apparatus. Although depending on the thickness of the silicon epitaxial layer 20 to be formed, performing the series of growth procedures once typically requires approximately 3 min to 5 min.

<Cleaning Step>

In the cleaning step, the inside of the process chamber 300 is vapor phase etched with a gas containing hydrogen chloride. The time during which the vapor phase etching is performed can be appropriately determined depending on the multi depo number. More specifically, the inside of the process chamber 300 is heated to a predetermined temperature, and the gas containing hydrogen chloride is delivered into the process chamber 300, thus silicon deposited inside the process chamber 300 through epitaxial growth is vapor etched. For example, the temperature inside the process chamber 300 may be set to 900° C. or more and 1200° C. or less, and the gas containing hydrogen chloride may be delivered for 10 s or more and 1500 s or less.

In this embodiment, a so-called multi depo process is performed: namely, a plurality of silicon wafers 10 are subjected to a series of epitaxial growth procedures which is repeated a predetermined number (multi depo number) of times without cleaning the process chamber 300 after each process. This being the case, in this embodiment, the above-mentioned cleaning step is performed before and after repeating the series of growth procedures including the first step, the second step, the third step, and the fourth step a predetermined number (multi depo number) of times under the same conditions.

<Determination of Predetermined Number of Times (Multi Depo Number)>

Here, in this embodiment, the correspondence between the total number of nitrogen flushing operations on the transfer chamber 200 throughout the series of growth procedures performed the predetermined number of times (hereinafter "total purge number") and the maximum number of the series of growth procedures (maximum multi depo number) is predetermined, and the predetermined number of times (multi depo number) is set within the maximum number of the series of growth procedures.

As will be described in detail below in the Examples, our study revealed that the maximum multi depo number greatly depends on the total purge number. We found that no backside haze was formed on the epitaxial silicon wafer 1 when the multi depo number was set within the maximum multi depo number. This also applies to the case where epitaxial growth conditions such as thickness are changed.

Note that the total purge number can be defined as follows. This definition is based on the assumption that the entire gas in the transfer chamber 200 is replaced when nitrogen gas is introduced by an amount corresponding to the volume of the transfer chamber 200. First, the purge number per series of growth procedures ("purge number per depo") is defined by the following formula [1].

$$[\text{Purge number per Depo}] = \frac{[\text{Growth time (min)}] \cdot \left[\begin{array}{c}\text{Purge flow rate of Nitrogen into} \\ \text{Transfer chamber } (slm)\end{array}\right]}{[\text{Volume of transfer chamber}(L)]} \quad [1]$$

Accordingly, the total purge number of purges of the transfer chamber 200 with nitrogen gas after performing the multi depo process the multi depo number of times is defined by the following formula [2].

$$[\text{Total purge number}]=[\text{Multi depo number}]\cdot[\text{Purge number per Depo}] \quad [2]$$

Here, the correspondence between the total purge number and the maximum multi depo number can be determined for example as follows. First, a silicon wafer of the same type as the silicon wafer 10 used in the production of an epitaxial silicon wafer according to this embodiment is prepared. This silicon wafer of the same type is hereinafter referred to as a test silicon wafer. An epitaxial silicon wafer is formed by performing the multi depo process under a first set of conditions using the test wafer. Further, an epitaxial silicon wafer is formed by performing the multi depo process under a second set of conditions in which only the purge flow rate of nitrogen into the transfer chamber is changed from the first set of conditions. The presence or absence of a backside haze on the epitaxial silicon wafer formed under each set of conditions was determined by observation, the threshold number of times, that is, the number of depositions causing a backside haze is determined, and a calibration curve can be found based on the obtained threshold. Instead of performing the observation, it is also preferred to measure the haze value, which is an indication of the surface roughness of the epitaxial silicon wafer formed. The haze value can be obtained by measurement using, for example, a particle counter SP-1 manufactured by KLA-Tencor Corporation in the DWN mode.

Figure 4:
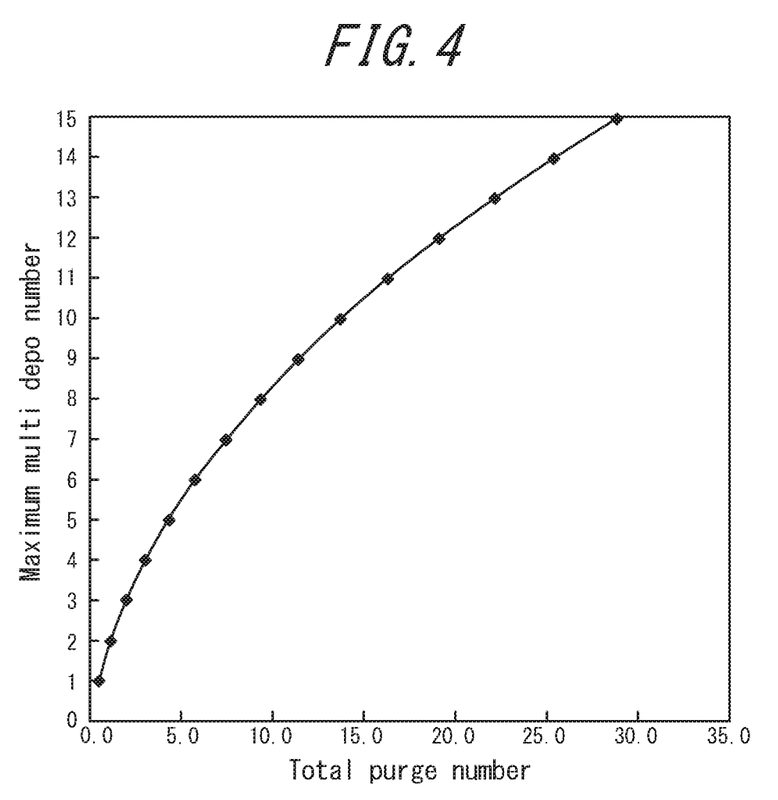
FIG. 4 is a graph illustrating the relation between the total purge number for a transfer chamber and the maximum multi depo number in Experimental Example 2.
Figure 5:
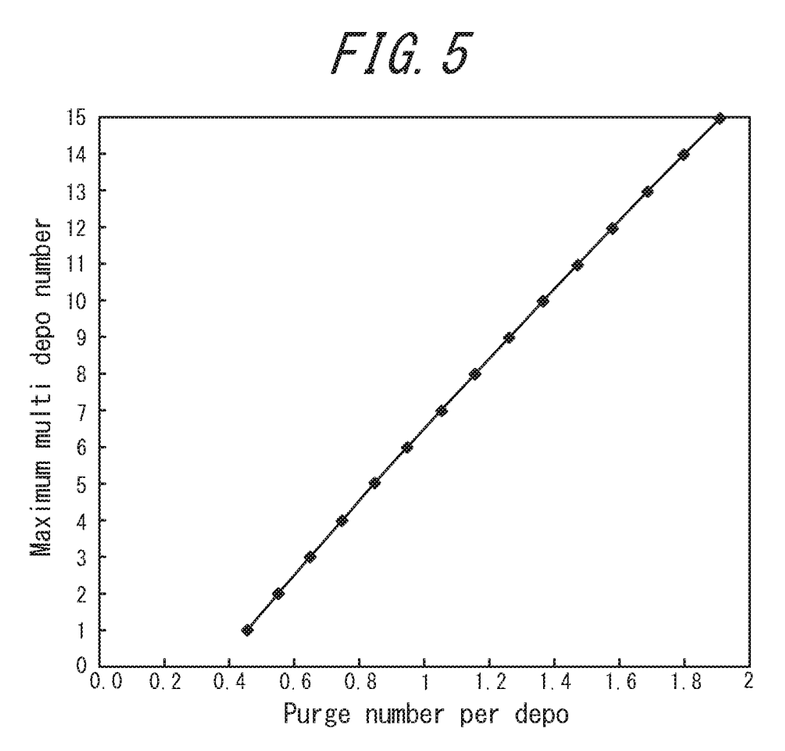
FIG. 5 is a graph illustrating the relation between the purge number for a transfer chamber per deposition and the maximum multi depo number in Experimental Example 2.

Examples of the thus obtained calibration curve are presented in FIGS. 4 and 5 to be described in Examples. The graphs demonstrated that in order to increase the maximum multi depo number, the number of purges with nitrogen gas needed to be increased at an increasing rate. In other words, the purge number per depo needed to be increased.

Preferably, in predetermining the above correspondence, the flow rate of nitrogen gas purge of the transfer chamber 200 is changed and the exhaust velocity for the transfer chamber 200 is adjusted depending on the change in the nitrogen gas purge flow rate. This maintains a balance between the pressures of the transfer chamber 200 and the process chamber 300.

In order to increase the nitrogen gas purge flow rate, the pressure or the flow rate of nitrogen gas may be increased using the inlet tube 210 through which the nitrogen gas flows in. Specifically, the filter pressure drop may be reduced, or the number of inlets may be increased.

EXAMPLES

Next, in order to clarify the effects of this disclosure, examples are given below, however, this disclosure is not limited to the following examples in any way.

Experimental Example 1

First, the following experiments were performed to find the difference of the formation of a backside haze between the first half of the multi depo process and the latter half of the multi depo process.

A silicon epitaxial wafer was produced according to the following procedure by the multi depo process using the epitaxial growth apparatus depicted in FIG. 1. As a substrate for the silicon epitaxial wafer, a boron-doped silicon wafer 10 having a diameter of 300 mm was used.

<Conditions 1>

The silicon wafer 10 was loaded from the first load-lock chamber 100 into the process chamber 300, followed by hydrogen bake-out, and a silicon epitaxial film was then grown at 1130° C. by 2 µm to form an epitaxial silicon wafer 1, which was unloaded to the second load-lock chamber. Thus, a series of growth procedures was performed. This series of growth procedures was repeated up to the fifteenth deposition. Each deposition took 200 s including the transfer time required to unload and load the wafer and the growth time. Trichlorosilane gas was used as a raw material source gas, diborane gas as a dopant gas, and hydrogen gas as a carrier gas.

<Conditions 2>

An epitaxial silicon wafer was formed by repeating the multi depo process up to the fifteenth deposition under the above Conditions 1 except that the nitrogen gas purge flow rate for the transfer chamber 200 was increased by 18% from that of Conditions 1. Note that the pressure of the transfer chamber was adjusted proportionately with the increase of the purge flow rate, and the balance between the pressures of the transfer chamber 200 and the chamber 300 was maintained to substantially the same degree as that in Conditions 1.

The back surfaces of the epitaxial silicon wafers produced under Conditions 1 and Conditions 2 were subjected to measurement using a particle counter SP-1 manufactured by KLA-Tencor Corporation in the DWN mode to determine the haze value. The results are given in FIG. 3.

Figure 3:
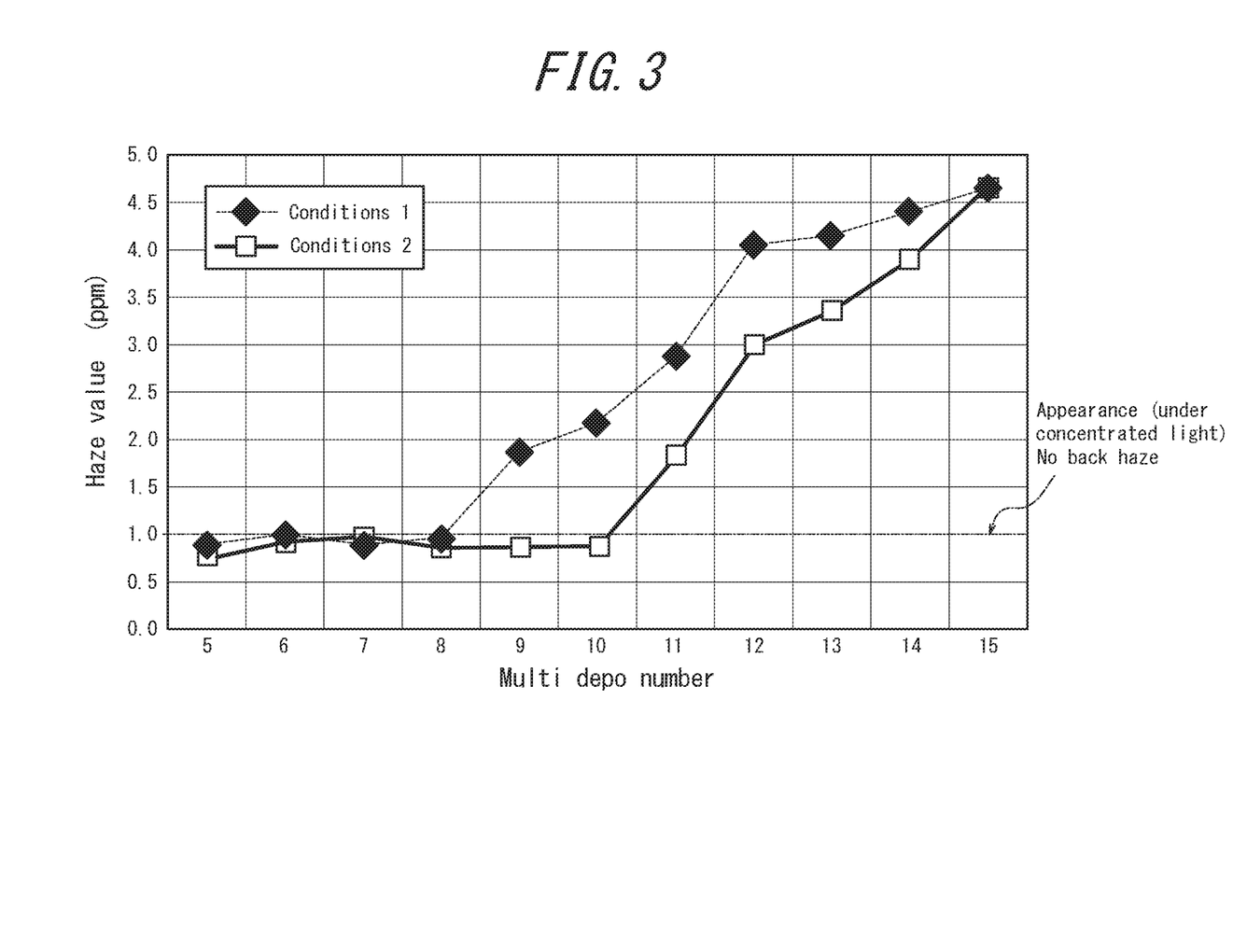
FIG. 3 is a graph illustrating the relation between the number of the series of epitaxial growth procedures and the haze value in Experimental Example 1.

Under Conditions 1, no backside haze was observed during the first 8 depositions under concentrated light, and a backside haze was observed from the ninth deposition. Accordingly, the maximum multi depo number under Conditions 1 was 8. The total number of flushing operations by a nitrogen purge of the transfer chamber in the first 8 depositions under Conditions 1 was calculated as 9.2 (approximately 1.2 purges per deposition).

On the other hand, under Conditions 2, no backside haze was observed during the first 10 depositions under concentrated light, and a backside haze was observed from the eleventh deposition. Accordingly, the maximum multi depo number under Conditions 2 was 10. Further, the haze value was found to increase sharply as the multi depo process was continued beyond the maximum multi depo number of times. The total number of flushing operations by a nitrogen purge of the transfer chamber in the first 10 depositions under Conditions 2 was calculated as 13.7 (approximately 1.4 purges per deposition).

Experimental Example 2

The correspondence between the total number of flushing operations by a nitrogen purge of the transfer chamber and the maximum multi depo number was determined in the same manner as in Experimental Example 1 except that the nitrogen gas purge flow rate for the transfer chamber 200 was changed. The results are given in FIG. 4. FIG. 4 demonstrates that the formation of a backside haze was prevented by setting the multi depo number depending on the total purge number.

Further, it was also found that the total number of flushing operations by a nitrogen purge of the transfer chamber is required to be sharply increased in order to increase the maximum multi depo number. Although a larger number of flushing operations performed by a nitrogen purge of the transfer chamber is considered to reduce the effect of oxygen; however, oxygen is not readily exhausted from the transfer chamber by a nitrogen purge. Conceivably, in the latter half of the multi depo process, adsorption of oxygen components onto the inner surface of the transfer chamber was saturated and desorption of oxygen from the inner surface of the transfer chamber suddenly became dominant. Thus, the correlation between a backside haze and the purge number is considered to have sharply changed.

As described above, the formation of a backside haze in the latter half of the multi depo process can be prevented by predetermining the correspondence between the total number of purges of the transfer chamber using nitrogen gas in the case of performing the multi depo process the multi depo number of times and the maximum multi depo number and setting the multi depo number based on the correspondence, thus the productivity can be improved.

Further, the relation between the maximum multi depo number and the purge number for the transfer chamber per deposition, which is derived from the graph of FIG. 4 is presented in FIG. 5. Setting the maximum multi depo number based on the purge number for the transfer chamber per deposition can prevent the formation of a backside haze in the latter half of the multi depo process. On the other hand, adjusting the purge number for the transfer chamber per deposition (i.e., the purge flow rate of nitrogen gas in the transfer chamber) can also prevent the formation of a backside haze in the latter half of the process.

INDUSTRIAL APPLICABILITY

This disclosure provides a method of producing an epitaxial silicon wafer, which is excellent in productivity and prevents the formation of a backside haze in consecutive single-wafer processing epitaxial growth procedures on a plurality of silicon wafers without cleaning a process chamber after each epitaxial growth procedure.

REFERENCE SIGNS LIST

1: Epitaxial silicon wafer;
10: Silicon wafer;
20: Silicon epitaxial layer;
50: Gate valve;
100: (First) load-lock chamber;
150: Gate valve;
200: Transfer chamber;
210: Inlet tube;
220: Outlet tube;
250: Gate valve;
300: Process chamber;
310: Susceptor;
400: Storage enclosure.

The invention claimed is:

1. A method of producing an epitaxial silicon wafer, which epitaxially grows a silicon epitaxial layer on a silicon wafer, comprising:
  cleaning a process chamber by vapor etching the process chamber with a gas containing hydrogen chloride;
  performing a growth procedure to grow a silicon epitaxial layer on a silicon wafer under a predetermined set of conditions, the growth procedure comprising:
    loading the single silicon wafer from a first load-lock chamber into a transfer chamber kept purged with nitrogen gas;
    loading the single silicon wafer from the transfer chamber into the process chamber;
    forming the silicon epitaxial layer on a surface of the single silicon wafer in the process chamber; and
    unloading the single silicon wafer on which the silicon epitaxial layer is formed from the process chamber to the transfer chamber and then unloading the single silicon wafer to a second load-lock chamber;
  repeating the growth procedure a predetermined number of times under the same predetermined set of conditions each said growth procedure being performed on a different silicon wafer; and
  after repeat the growth procedure the predetermined number of times, cleaning the process chamber by vapor etching the process chamber with a gas containing hydrogen chloride;
  wherein the predetermined set of conditions and the predetermined number of growth procedures is determined by a method comprising:
    determining a threshold number of times that the growth procedure under a set of conditions can be performed without cleaning the process chamber before a backside haze develops on a test silicon wafer, comprising:
performing the growth procedure on a test silicon wafer under the set of conditions;
repeating the growth procedure a number of times under the same set of conditions, each said growth procedure being performed on a different test silicon wafer; and
determining the number of times the growth procedure under the set of conditions was performed without cleaning the process chamber before a backside haze developed on a test silicon wafer to obtain the threshold number of times the growth procedure can be performed under the set of conditions before a backside haze develops;
repeating one or more times the determining of a threshold number of times the growth procedure under a set of conditions can be performed without cleaning the process chamber before a backside haze develops on a test silicon wafer, wherein the set of conditions is the same for each determining of a threshold number, except that a rate at which the nitrogen gas is purged from the transfer chamber is changed for each determining of a threshold number;
creating a calibration curve of a relationship between a threshold number of growth procedures and a total number of nitrogen purges performed to obtain that threshold number based on the threshold numbers obtained and the rate at which the nitrogen gas was purged from the transfer chamber for the respective threshold number;
selecting from the calibration curve a threshold number of growth procedures;
setting the predetermined number of growth procedures to be equal to or less than the selected threshold number of growth procedures; and
setting the predetermined set of conditions to be equal to the set of conditions used to obtain the selected threshold number of growth procedures, including the rate at which the nitrogen gas was purged from the transfer chamber for determining the selected threshold number of growth procedures.

2. The method of producing an epitaxial silicon wafer, according to claim 1, wherein changing the rate at which the nitrogen gas is purged from the transfer chamber includes adjusting an exhaust velocity for the transfer chamber.

* * * * *